United States Patent [19]
Lancaster et al.

[11] Patent Number: 5,774,400
[45] Date of Patent: Jun. 30, 1998

[54] STRUCTURE AND METHOD TO PREVENT OVER ERASURE OF NONVOLATILE MEMORY TRANSISTORS

[75] Inventors: Loren T. Lancaster; Ryan T. Hirose, both of Colorado Springs, Colo.

[73] Assignee: NVX Corporation, Colorado Springs, Colo.

[21] Appl. No.: 772,970

[22] Filed: Dec. 23, 1996

Related U.S. Application Data

[60] Provisional application No. 60/009,225, Dec. 26, 1995.

[51] Int. Cl.$^6$ .................................................. G11C 11/40
[52] U.S. Cl. ................................ 365/185.3; 365/185.24; 365/185.18; 365/185.29
[58] Field of Search ....................... 365/185.24, 185.18, 365/185.28, 185.29, 185.3

[56] References Cited

U.S. PATENT DOCUMENTS

| | | | |
|---|---|---|---|
| 5,327,385 | 7/1994 | Oyama | 365/185.24 |
| 5,477,485 | 12/1995 | Bergemont et al. | 365/185.24 |
| 5,586,073 | 12/1996 | Hiura et al. | 365/185.24 |

FOREIGN PATENT DOCUMENTS

| | | | |
|---|---|---|---|
| WO 94/10686(A1) | 5/1994 | WIPO | G11C 11/40 |

OTHER PUBLICATIONS

Miyawaki et al. "A New Erasing and Row Decoding Scheme for Low Supply Voltage Operation 16–Mb/64–Mb Flash Memories", IEEE Jour. Solid–State Circuits, vol. 27, No. 4, Apr. 1992 pp. 583–588.

Momodomi et al., "An Experimental 4–Mbit CMOS EEPROM with a NAND–Structured Cell", IEEE Jour. Solid–State Circuits, vol. 24, No. 5, Oct. 1989 pp. 1238–1243.

Lundström, et al., "Properties of MNOS Structures", IEEE Jour. Solid–State Circuits, vol. ED–19, No. 6, Jun. 1972 pp. 826–836.

Nozaki, et al., "A –1Mb EEPROM with MONOS Memory Cell for Semiconductor Disk Application", IEEE Jour. Solid–State Circuits, vol. 26, No. 4, Apr., 1991 pp. 497–501.

Suzuki, et al., "A Low Voltage Alterable EEPROM with Metal–Oxide–Nitride–Oxide Semiconductor (MONOS) Structures", IEEE Jour. Solid–State Circuits, vol. ED–30, No. 2, Feb., 1983.

Svensson et al., "Trap–assisted charge injection in MNOS structures", J. Appl. Phys, vol. 44, No. 10, Oct. 1973 pp. 46574663.

Sze, *Physics of Semiconductor Devices*, Wiley–Interscience, 1969, pp. 425–437.

*Primary Examiner*—Vu A. Le
*Attorney, Agent, or Firm*—Richard A. Bachand; Holland & Hart LLP

[57] ABSTRACT

A method and structure for preventing over erasure in non-volatile memory cells uses simultaneous erase and program current injections which offset one another. These currents come from two separate injection points within the non-volatile memory transistor and are dominant at different points during the erase operation. The first occurring current erases the non-volatile device and the second prevents over erasure.

33 Claims, 7 Drawing Sheets

5,774,400

STRUCTURE AND METHOD TO PREVENT OVER ERASURE OF NONVOLATILE MEMORY TRANSISTORS

CROSS REFERENCES TO RELATED APPLICATIONS

This application is related to copending United States Provisional patent application, Ser. No. 60/009,225, filed Dec. 26, 1995, to which reference is expressly made, and which is incorporated herein in its entirety, by reference.

BACKGROUND OF THE INVENTION

1. Field of the Invention

This invention relates to improvements in electrically erasable, electrically programmable read-only memory cells used for data storage, and to methods for making and using same.

2. Description of the Related Art

The demand for portable and hand held devices which require data or code storage has grown substantially within recent years and is expected to continue to grow well into the next decade. Products such as digital cameras, cellular telephones, personal organizers, voice recording devices and palm-top personal computers as well as a host of specialized remote data collection tools are available today, and new products are in development. In nearly all of these products, data is stored on solid state electronic media rather than on a hard disk drive. This is due to the requirements of higher performance, lower energy consumption, and superior ruggedness of solid state media, compared to hard disk drive technologies.

Solid-state media typically use non-volatile metal-insulator-silicon (MIS) memory transistors to store the data. Logic states, binary "1" or binary "0", are typically written to such non-volatile MIS memory transistors by storing injected charge between the gate of the device and its channel. In the case of floating gate devices, the charge is stored on a dielectrically isolated polysilicon node that lies between a control gate and a channel region. In the case of a dielectric storage device, the charge is stored in traps in the memory dielectric, or in the case of SONOS (silicon-oxide-nitride-oxide-silicon) in the silicon nitride. In either case, when a net negative charge is stored, the threshold voltage of the device is shifted positively into a program state. When a net positive charge is stored, the threshold voltage of the device is shifted negatively into an erase state.

For non-volatile memory array applications, it is advantageous to design a non-volatile memory cell and its associated bias system in a way that the cell neither draws nor produces significant current when it is not selected, or deselected, regardless of its state. In this way, the state of selected cells can be determined without interference from deselected cells. In the past, current from deselected memory cells was eliminated by use of a separate select transistor in each and every cell which isolated the memory transistor from shared lines in the array. In this case, the nonvolatile memory transistor in the cell was deeply erased to provide the best possible end-of-life current, with no concern of interference, since the select transistor isolated the memory transistor. However, since the select transistor consumes area, many manufacturers have recently developed single transistor cells, where the transistor is a non-volatile transistor that can be biased in a way to provide deselection without an additional select device.

In these single transistor devices, a challenge is to minimize the current from a deselected device by tightly controlling the erase state threshold voltage above a desired minimum level. Current leakage from erased deselected cells will then be predictably low, enabling circuit designs which use faster sensing times with lower power consumption. Since cells with threshold voltages below the desired minimum level result in less than optimal performance, these cells are said to be "over erased".

Frequently, great measures are taken in current nonvolatile memory products to minimize over erasure in order to ensure the best performance. A typical approach to avoiding over erasure in single transistor cells is to measure the distribution of the erased state threshold voltages within the array, and then selectively correct the threshold voltage of those devices which fall below an acceptable limit. A second approach is to utilize a "soft program" technique, where erased cells are slightly programmed after erase. More deeply erased cells program faster than normal cells, leading to a natural convergence within the erase threshold voltage distribution, with the entire distribution lying above the minimum acceptable level. Other similar approaches have been developed over the last few years, primarily for use with floating gate flash type memories. However, all current approaches significantly extend the effective time needed to erase bits, since extra time is required to "correct" the over erased bits.

A detailed understanding of current flow mechanisms in nonvolatile transistors is helpful in developing new means to manage over erasure. For example, it is known that hole current tunnels from the channel region of SONOS transistors into the silicon nitride where it is trapped during an erase operation. With the application of an electric field, the two energy levels of the free carriers in the channel and the unoccupied states in either the nitride or the tunnel oxide are aligned to the same level. When this occurs, as shown in the energy band diagrams in FIG. 2, the erase current increases substantially since the probability of tunneling is very high.

FIG. 2 shows the energy band diagram for three tunnel current mechanism, which by design can be used separately or together. A fourth tunneling mechanism which is not shown is trap assisted tunneling. The three processes shown in FIG. 2 are known as Fowler-Nordheim tunneling, direct Fowler-Nordheim tunneling, and modified Fowler-Nordheim tunneling. Three separate diagrams are used to illustrate these three mechanisms where the valence band is shown for the lower three layers of a SONOS structure 10, including a single crystal silicon substrate 40, a silicon dioxide layer 41 and a silicon nitride layer 42. Each of the three diagrams included in FIG. 2 shows the conduction band edge 11 and the valence band edge 12 of silicon substrate 40, the valence band edge 13 of silicon dioxide layer 41, and the valence band edge 14 of silicon nitride layer 42. In accordance with conventional quantum mechanical energy band diagrams, the valence band lies beneath the valence band edge, the conduction band lies above the conduction band edge, and the forbidden gap lies between the conduction band and valence band edges.

The FIG. 2 diagram labeled "Modified Fowler-Nordheim Tunneling" shows current 200 tunneling from the channel region 30 into the valence band of silicon nitride 42. Current 200 is positively charged free holes that originate in the accumulation layer in channel 30 and tunnel completely through the silicon dioxide layer 41 and partially through the silicon nitride layer 42 into the silicon nitride valence band. This current flow 200 is described by a set of equations known to those skill in the art of SONOS technology as modified Fowler-Nordheim Tunneling.

The FIG. 2 diagram labeled "Direct Tunneling" shows current 201 tunneling from the channel region 30 tunnel completely through silicon dioxide layer 41 directly into the silicon nitride 42 valence band. The electric field across the silicon dioxide layer 41 is higher in this second diagram than in the first diagram, causing the silicon nitride valence band edge 14 to be aligned to the same energy level as the valence band edge 12 in substrate 40. As a result, holes in the channel region 30 can tunnel directly through silicon dioxide layer 41 into the silicon nitride 42 valence band without having to tunnel through the silicon nitride forbidden gap. This current flow 201 is described by a set of equations known as direct tunneling.

The FIG. 2 diagram labeled "Fowler-Nordheim Tunneling" shows current 202 tunneling from the channel region 30 partially through silicon dioxide layer 41 into the silicon dioxide valence band, where the charge carriers are free to drift into the silicon nitride 42 valence band. The electric field across the silicon dioxide layer 41 in this diagram is the highest among the three diagrams, causing the silicon dioxide valence band edge 13 to be aligned to the same energy level as the valence band edge 12 in substrate 40. As a result, holes in the channel region 30 tunnel into the silicon dioxide layer 41 and then drift under influence of the electric field into the silicon nitride 42. This current flow 202 is described by a set of equations known as Fowler-Nordheim tunneling.

Further, it is known that as the silicon nitride layer 42 becomes thin (<120 Å) in a SONOS structure, charge injection from the gate electrode affects the tunnel current from channel 30. FIG. 3 shows the quantum mechanical band diagram for a SONOS structure 10, including a single crystal silicon substrate 40, a bottom tunnel silicon dioxide layer 41, a silicon nitride layer 42, a top blocking silicon dioxide layer 43, and a silicon gate layer 44. Also shown are the conduction band edge 11 and the valence band edge 12 of silicon substrate 40, the valence band edge 13 of the tunnel silicon dioxide layer 41, the valence band edge 14 of silicon nitride layer 42, the valence band edge 15 of the top blocking oxide 43, and the valence band edge 16 and the conduction band edge 17 of the silicon gate 44.

It is desirable to prevent gate injection by placing a blocking dielectric 43 between the gate 44 and the silicon nitride 42 since the effect of gate injection can otherwise be substantially detrimental. Such a blocking oxide 43 (typically 40–60 Å) has been described in many publications. Also shown in prior publications is that holes injected from the channel 30 build in the nitride 42 during erase and can eventually cause Fowler-Nordheim current to flow from the gate 44 electrode through the blocking oxide 43.

In the past, two approaches have been used to select the thickness of blocking oxide 43. Some choose the thickness to ensure layer 43 is just thick enough to block injection of charge from gate 44 at the end of erase operation allowing the thickest nitride layer 43 for a given erase gate voltage. Others have chosen to make the blocking oxide 43 thicker than that required to prevent gate injection in order to keep the charge stored in the nitride 43 and at the nitride-blocking oxide interface as close to the channel 30 as possible compared to the overall dielectric thickness. In both cases a select transistor is used so that over erasure causes no loss in performance and a deeply erased threshold voltage is desirable.

A typical erase operation using blocking oxide 43 could be describes as follows. During erase, an electric field is placed across the SONOS stack, and consequently the tunnel dielectric 41. The field across the tunnel oxide 41 is chosen by design to generate sufficient hole tunnel current 200 from channel 30 to achieve a specified erase threshold voltage within a predetermined period of time, typically 100 μsec to 100 msec. The field in the oxide is typically 8–10 MV/cm and typically sufficient to move the silicon nitride valence band edge 14 at the tunnel oxide/nitride interface up by approximately 1.3 to 2.0 eV in order to enable one of the four tunneling mechanisms discussed above. This bias condition is shown in the energy band diagram in FIG. 3. Here an applied voltage is shown with no charge 50 accumulated in silicon nitride 42, such that the electric field across the bottom tunnel oxide 41 (Ebox 100) is equal to that across the top blocking oxide 43 (Etox 101). Since the top blocking oxide 43 is thicker than the bottom tunnel oxide 41, the bottom tunnel current 200 is much greater than the top oxide 43 tunnel current. Under the bias conditions shown in FIG. 3 the top oxide 43 current is negligible and so no top oxide 43 tunnel current is shown. Thus the bottom current 200 is called the first erase current.

Referring now to FIG. 4, while the holes from the erase current accumulate at charge domain 50 in the nitride 42, the voltages inside the oxide-nitride-oxide (ONO) stack redistribute and the internal electric fields change accordingly. If the applied gate to channel voltage remains constant during the erase, the charge accumulation 50 and resulting shift in the electric fields causes the voltage across tunnel oxide 41 to drop while the voltage across the blocking oxide 43 increases. The reduction in field 100 and voltage across the tunnel oxide 41 substantially reduces the first tunnel current 200, since the tunnel current varies exponentially with linear changes in electric field. Likewise, the field 101 increases. FIG. 3 shows the thickness of the top blocking oxide 43 has been chosen to produce negligible current 205 at the end of the erase operation.

Although the detailed understanding of current flow in nonvolatile device is known as shown in the SONOS example above, no insight has been provided on how to utilized this understanding to design and operate transistors in ways that eliminate over erasure. Therefore, without further transistor innovations, product level verify and rewrite solutions will continue to be used to eliminate over erasure, adversely affecting performance of non-volatile memory products. A better solution would be to prevent over erasure from occurring in the first place by using innovative transistor designs so that no time is lost to a follow-on or embedded correction operation.

SUMMARY OF THE INVENTION

In light of the above, therefore, it is an object of the invention to provide an improved non-volatile semiconductor memory cell device and method of operating such device.

It is another object of the invention to provide an improved memory cell device and method of operating such device that produces lower current flow when deselected.

It is yet another object of the invention to provide an improved memory cell and method of operating such device that cannot be over erased.

It is still another object of the invention to provide an improved memory cell and method of operating such device that requires no threshold voltage verify and rewrite operations during an erase cycle.

It is still further an object of the invention to provide an improved memory cell and method of operating such device that requires less time to be erased by eliminating the need for a verify and rewrite cycle during the erase operation.

It is still yet another object of the invention to provide an improved memory cell and method of operating such device that requires less external circuitry to verify and rewrite the threshold voltage of the cell during an erase operation.

It is further another object of the invention to provide an improved memory cell and method of operating such device that cannot be over programmed.

The above and further objects, details and advantages of the invention will become apparent from the following detailed description, when read in conjunction with the accompanying drawings.

According to the present invention, there is provided a method for preventing over erasure in non-volatile memory cells. By using simultaneous erase and program current injections which offset one another, over erasure is prevented. As will become apparent below, these currents come from two separate injection points within the non-volatile memory transistor and are dominant at different points during the erase operation. The first occurring current erases the non-volatile device and the second prevents over erasure.

The primary principle employed is to use accumulating charge from the first current to create an electric field, which reduces the externally applied field that drives the first current, while simultaneously enhancing the externally applied field that drives the second current. As the erase operation proceeds, charge builds (either as mobile charge on a floating gate or as trapped charge in an insulator) and the two currents change as the building charge effects the fields that drive the two currents. Eventually, as the first current decreases and the second current increases, they become equal or nearly equal and no further significant charge accumulation can occur. Since changes in the currents are driven by changes in accumulated charge, both the first and second currents as well as the accumulated charge remain stable, producing a saturation effect.

According to the present invention, there is also provided a nonvolatile memory transistor whose threshold voltage can be electrically altered. The transistor is placed on a silicon substrate of a first conductivity type, and includes source and drain junctions of a second conductivity type, a conductive control gate, and a charge accumulation layer residing at least between portions of the control gate and the substrate, such as a layer of silicon nitride or a floating gate. The transistor also includes means to simultaneously inject charge or currents of opposite polarities into the charge accumulation layer by quantum mechanical tunneling from two separate sources within the transistor structure.

The tunneling current from both sources are designed to be a function of the accumulated charge, each affected in an opposite way to the other. When a write bias is applied to the nonvolatile transistor for a predetermined period of time, a first current source is initially dominant, causing a net increase in accumulation toward one polarity. As time progresses, the charge accumulation causes the flow from the first current source to decrease and the flow from the second current source to increase. At some point in time, preferably near the end of the predetermined amount of time, the flow from both sources become equal or nearly equal and charge can no longer accumulate, leading to a natural saturation which prevents over writing. In the case of an erase operation, over erasure is prevented.

BRIEF DESCRIPTION OF THE DRAWINGS

In the detailed description of the preferred embodiments of the invention presented below and in the related art description above, reference is made to the accompanying drawings of which.

In the various figures of the drawing, like reference numerals are used to denote like or similar parts.

DETAILED DESCRIPTION OF THE PREFERRED EMBODIMENT

Figure 1:
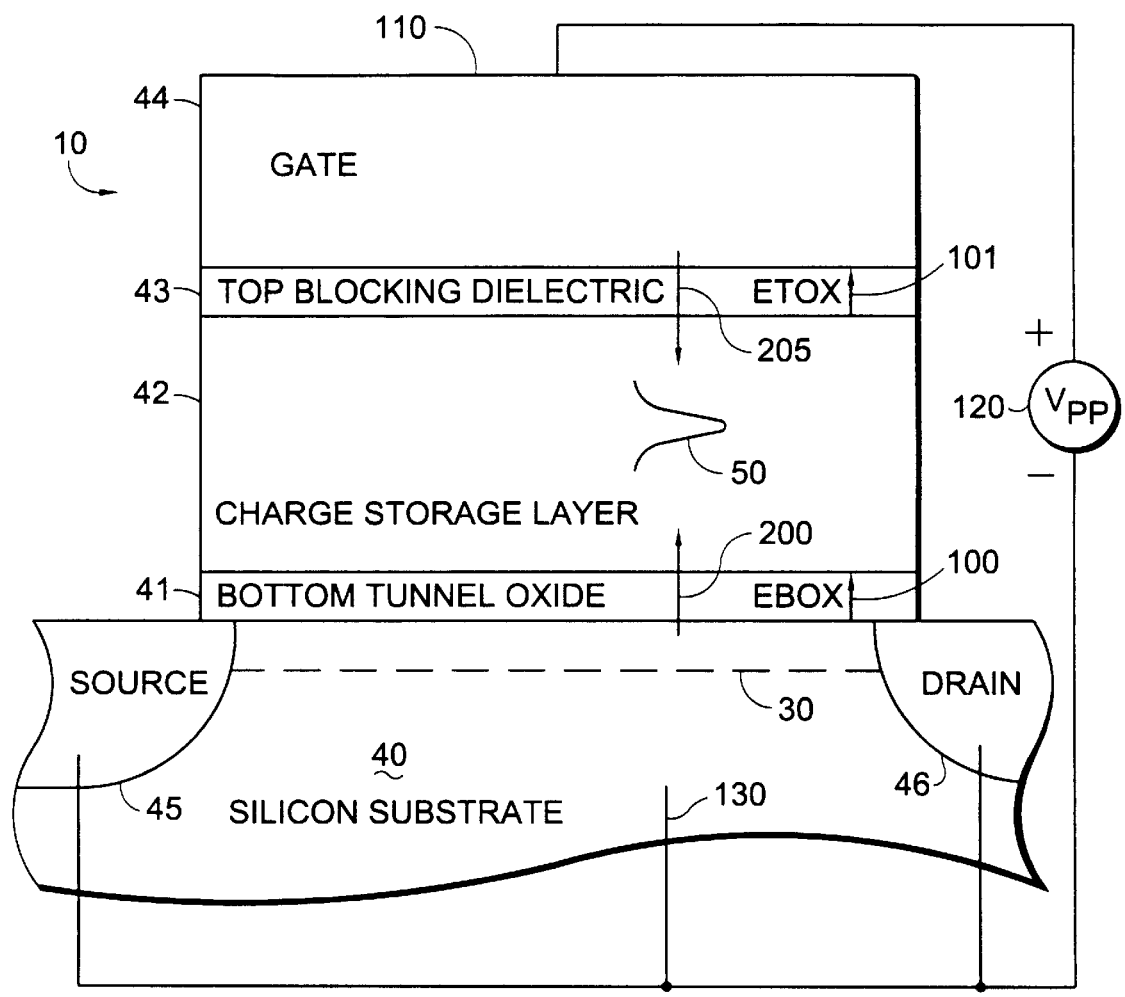
FIG. 1 shows a SONOS memory transistor structure, illustrating the current flow paths and electric fields created thereby together with the electric field created by an accumulated charge in the memory storage layer, according to the present invention.
Figure 2:
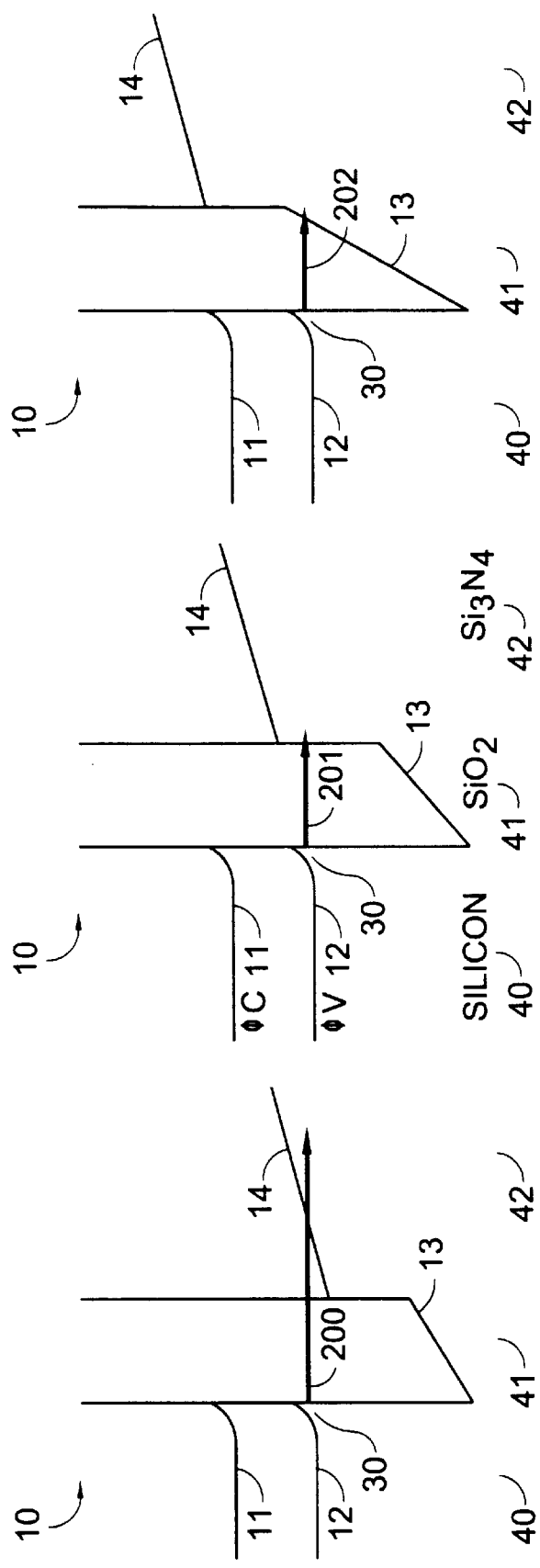
FIG. 2 shows a quantum mechanical energy band diagram of the lower three layers of a SONOS structure, including a single crystal silicon substrate, a silicon dioxide layer, and a silicon nitride layer, under three different bias conditions to show the "First Erase Current" as tunneling current on the valence band side of the band diagram.
Figure 3:
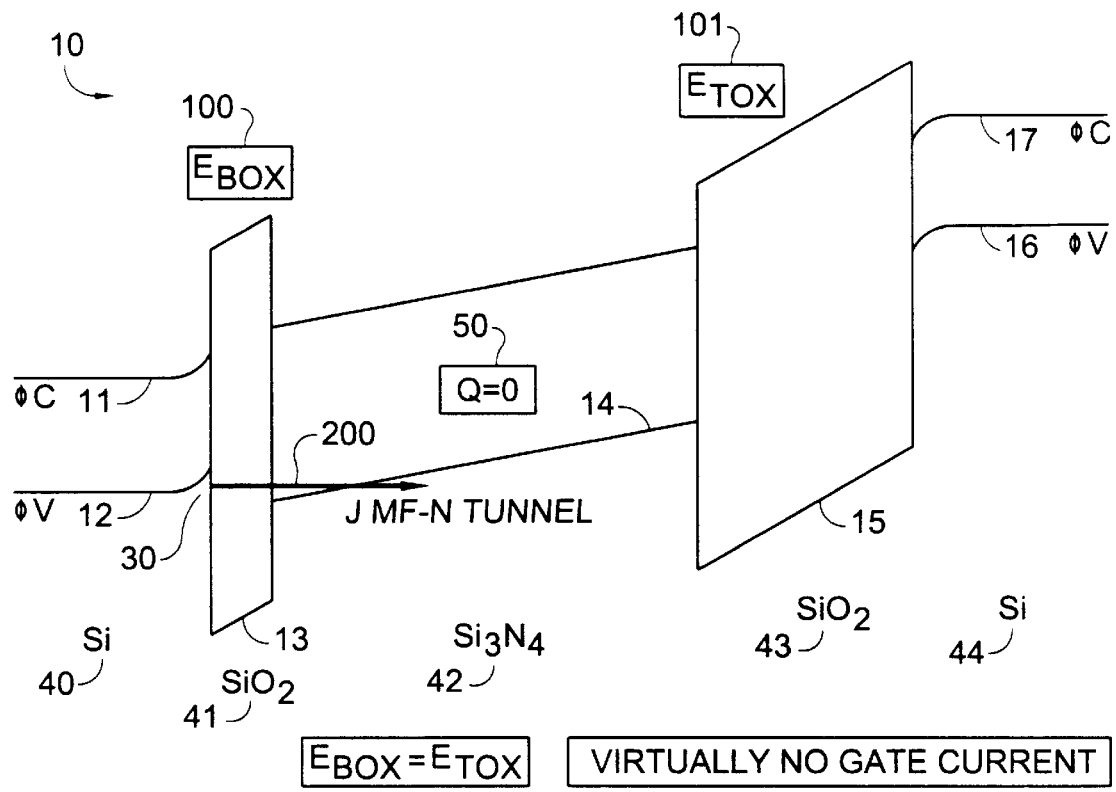
FIG. 3 shows a quantum mechanical energy band diagram of a five layer SONOS structure, including a single crystal silicon substrate, a layer of bottom silicon dioxide, a silicon nitride layer, a top (or blocking) layer of silicon dioxide, and a layer of polycrystalline silicon, under erase bias conditions with no charge accumulated in the nitride to show the "First Erase Current" and no gate injection.
Figure 4:
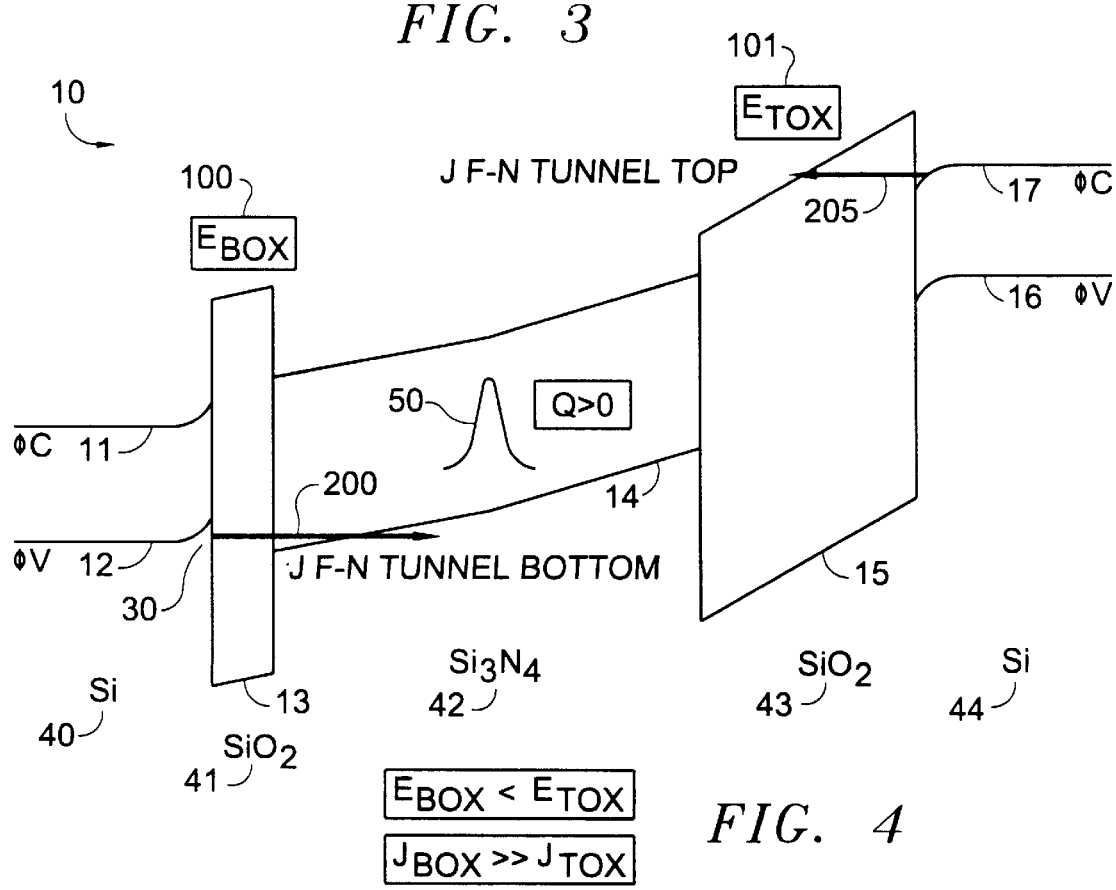
FIG. 4 shows a quantum mechanical energy band diagram of a five layer SONOS structure with a thick top "Blocking Oxide", including a single crystal silicon substrate, a layer of bottom silicon dioxide, a silicon nitride layer, a top (or blocking) layer of silicon dioxide, and a layer of polycrystalline silicon, under erase bias conditions with charge accumulated in the nitride to show the "First Erase Current" and minimal gate injection current.
Figure 5:
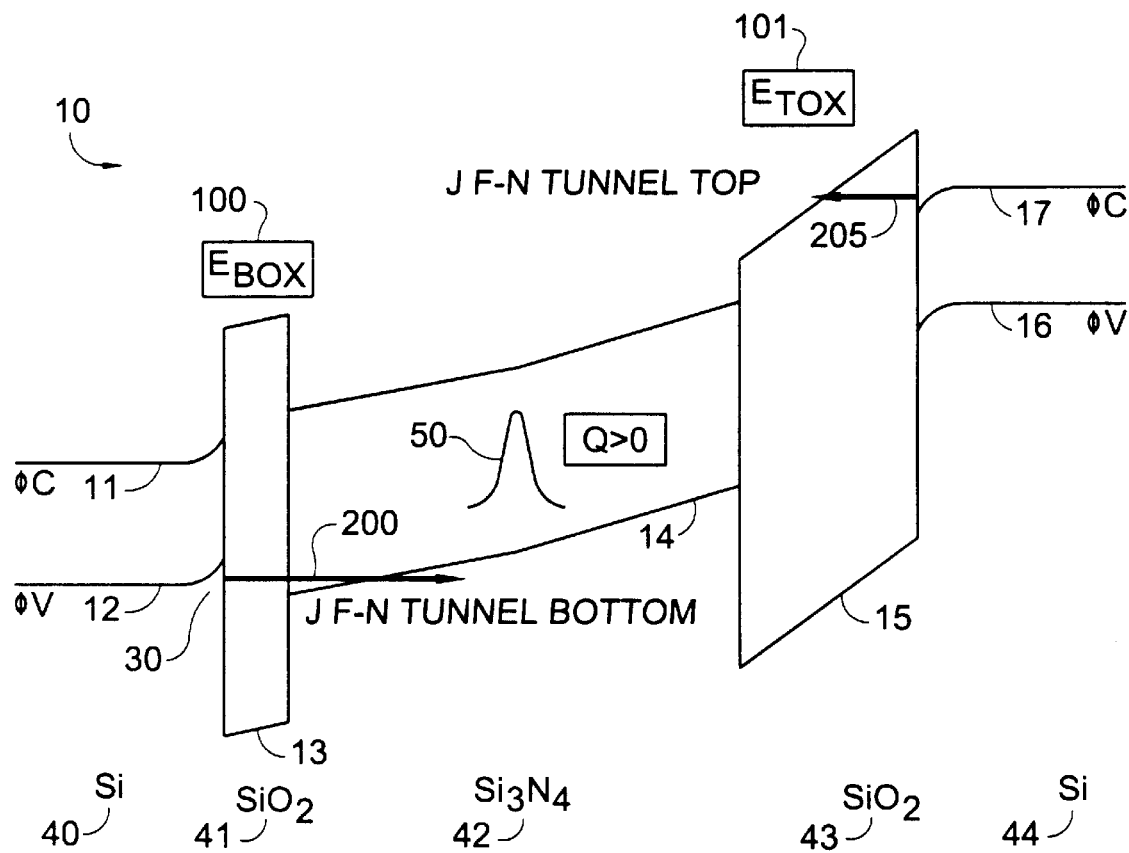
FIG. 5 shows a quantum mechanical energy band diagram of a five layer structure with a thin top "Blocking Oxide", including a single crystal silicon substrate, a layer of bottom silicon dioxide, a silicon nitride layer, a top (or blocking) layer of silicon dioxide, and a layer of polycrystalline silicon, under erase bias conditions with charge accumulated in the nitride to show the "First Erase Current" and substantial "Second Erase Current" gate injection where the top "Blocking Oxide" thickness is chosen to balance gate injection with the substrate tunneling current at a desired erase state threshold voltage, according to a preferred embodiment of the present invention.

According to a preferred embodiment of the invention, with reference first to FIG. 1, a SONOS transistor is designed to incorporate two injection mechanisms that operate simultaneously, utilizing a relatively thin blocking oxide, so that Fowler-Nordheim charge injection from the gate is ensured during the later part of the erase operation. FIG. 1 shows a SONOS transistor structure 10 comprising a silicon substrate 40 which includes source 45 and drain 46 junctions bordering a transistor channel 30 that resides substantially at the substrate surface. Above the substrate 40 resides a composite structure of a bottom tunnel oxide 41, a charge storage layer 42, a top blocking dielectric 43 and a conductive gate 44. An external power source 120 supplies voltage Vpp between the gate 44 at contact 110 and to the substrate 40 at least at point 130 to create internal electric fields EBOX 100 and ETOX 101 and corresponding currents 200 and 205 (in some applications Vpp need not be connected to source 45 and drain 46). Curve 50 represents the accumulate charge distribution in charge storage layer 42 resulting from currents 200 and 205. Thus, positive charge injection occurs from the channel, and negative charge injection occurs from the gate during the erase operation, preventing over erasure. As discussed above, the thickness of the blocking oxide is usually chosen such that the field that builds up during the erase produces no appreciable Fowler-Nordheim current. However as shown in FIG. 5, if the thickness of the blocking oxide 43 is chosen to be thinner than that which produces no appreciable gate injection during erase, appreciable gate current 205 will flow at some point during the erase cycle and this gate current 205, or second current, will eventually nearly equal the first current 200 injected from the channel. Charge 50 building up in the nitride 42 during erase simultaneously lowers the field 100 across the tunnel oxide 41 and increases the field 101 across the blocking oxide 43 as schematically shown by the slopes of band edges 13 and 15. As these fields change with increasing stored charge 50 during the erase operation, the first current 200 will decrease and the second current 205 will increase, both exponentially with linear changes in fields 100 and 101, respectively. At some point, these two currents will be equal or nearly equal to each other. At this point, the net additional charge injected into the nitride 42 is negligible and no further significant charge 50 accumulates. Thus, even though an erase bias may continue to be applied to the gate and currents 200 and 205 are flowing, no further charge 50 accumulates in the nitride 42 and the threshold voltage remains the same producing a saturation effect.

Figure 6:
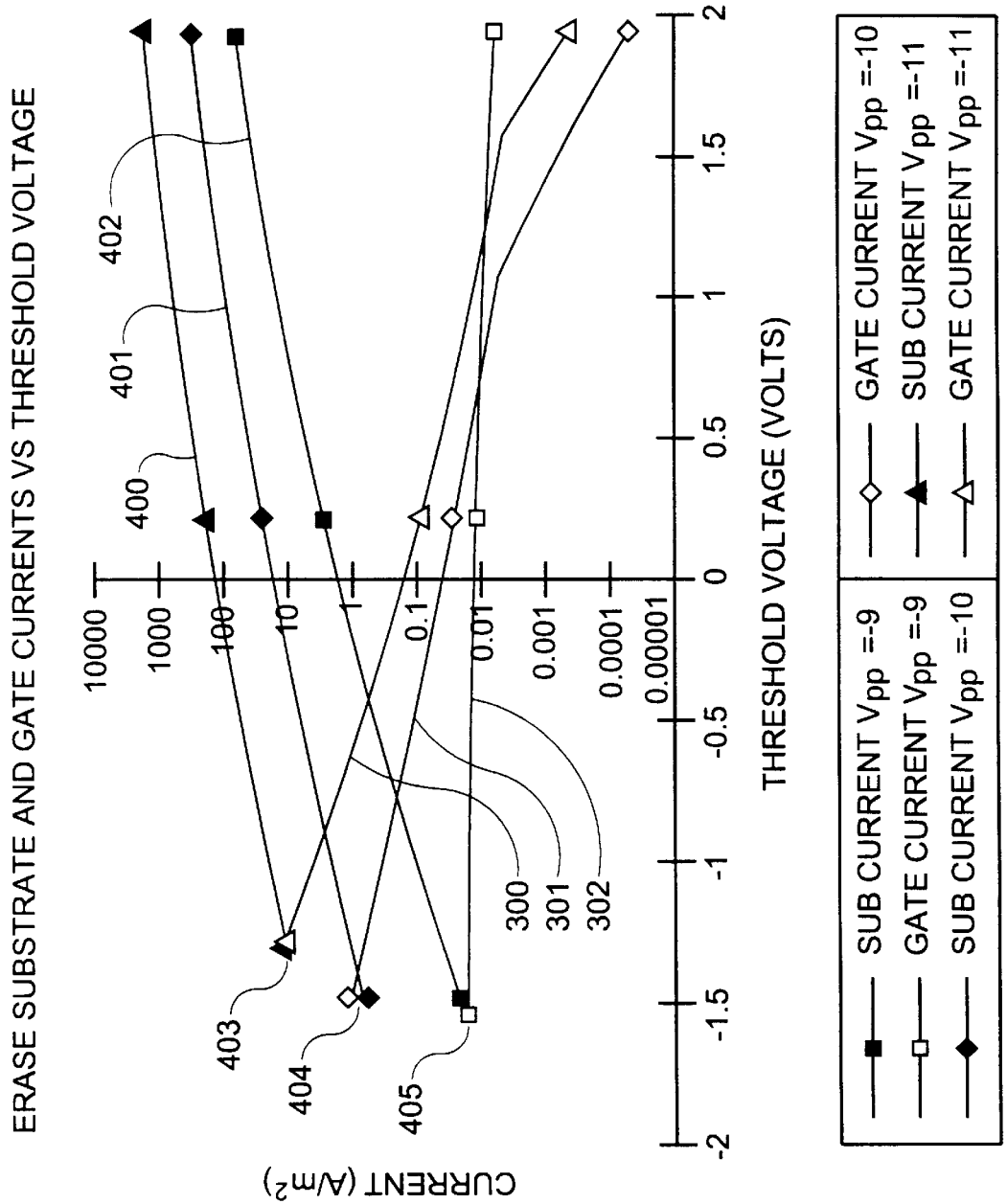
FIG. 6 shows a graph of the quantum mechanical tunneling current under various bias conditions that flows through the top and bottom silicon dioxide layers in the structure represented in FIG. 5 as a function of the threshold voltage of an MIS transistor incorporating the structure of FIG. 5, according to a preferred embodiment of the present invention.

Therefore, in contrast to choosing the blocking oxide 43 thickness such that no appreciable current 205 flows during erase, the blocking oxide 43 is chosen thinner in order to produce this saturation mechanism to prevent over erase in single transistor non-volatile memory cells. A simulation of first 200 and second 205 currents is shown in FIG. 6 as a function of the threshold voltage for a SONOS stack including a 35 Å top blocking oxide 43, a 117 Å nitride layer 42 and a 16 Å bottom tunnel oxide 41. The upper curves 400, 401 and 402 are the bottom tunnel currents 200 and the lower curves 300, 301 and 302 are the top tunnel currents 205, both expressed in amps/meter$^2$. Shown are the currents for three different applied erase voltages across the SONOS stack, −9, −10 and −11 volts. Both the top and the bottom currents 200 and 205 show exponential changes as the threshold voltage changes linearly. Eventually a threshold voltage is achieved at which the two currents are approximately the same at points 403, 404 and 405.

Figure 7:
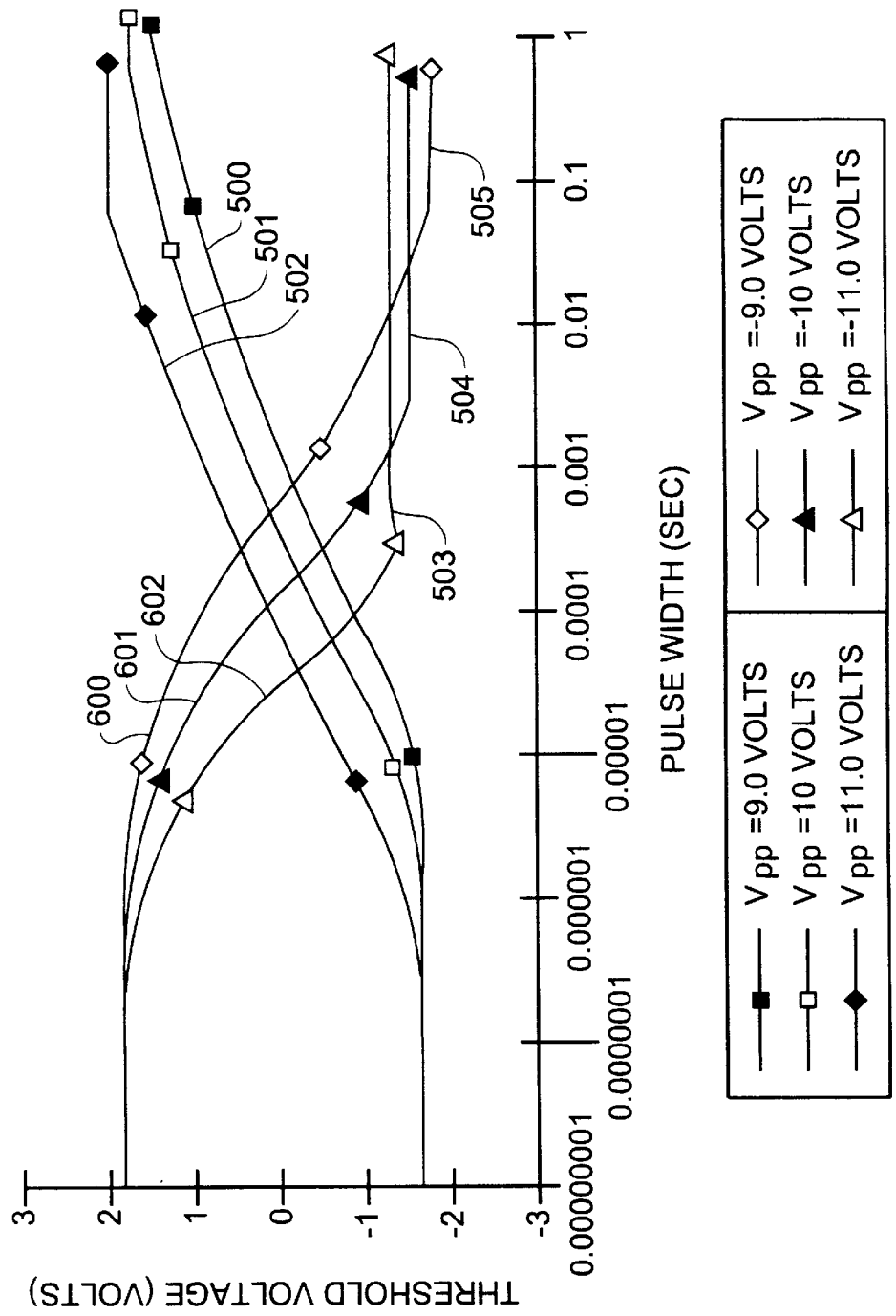
FIG. 7 shows a graph of the threshold voltage attained by an MIS transistor incorporating the structure represented by FIG. 5 as a function of write time (pulse width) under various write pulse voltage conditions according to a preferred embodiment of the present invention.

FIG. 7 shows a plot of the same SONOS structure threshold voltage as a function of write time. Curves 600, 601 and 602 show threshold voltage changes as a function of time under erase biases of −9.0, −10.0 and −11.0 volts respectively. Curves 500, 501 and 502 show threshold voltage changes as a function of time under program biases of +9.0, +10.0 and +11.0, volts respectively. Erase curves 600, 601 and 602 correspond to the currents shown in FIG. 6. The threshold voltage shown on the vertical axis of FIG. 7 corresponds with the horizontal axis of FIG. 6. The points 403, 404 and 405 at which the bottom current 200 and the top current 205 are equal produce the saturation effect 503, 504 and 505, receptively. Once the top current 205 and bottom current 200 are about equal, the net charge injection is near zero and the charge accumulation 50 does not change so the threshold voltage no longer changes appreciably. For example, FIG. 6 shows that for an applied potential of −10 volts, the top current 401 and bottom current 301 are equal at a threshold voltage of about −1.45 volts and FIG. 7 shows that once this value is achieved at 504 it remains nearly so. The calculated results shown in FIG. 7 agree very well with data collected from devices constructed with these actual thickness.

By choosing the thickness of the blocking oxide 43 appropriately the saturation point can be set at different threshold voltage values, as desired for the product design. For thinner blocking oxides 43, the gate injection currents 205 are higher at a given amount of charge accumulation 50 and thus saturation occurs at a smaller magnitude of threshold voltage deviation. For thicker blocking oxides 43, the gate injection current 205 is lower at a given accumulation 50 so saturation will occur at a larger magnitude of threshold voltage deviation. So the threshold voltage at saturation can be chosen by appropriately choosing the blocking oxide 43 thickness.

The erase threshold voltage saturation point can be set to ensure that the threshold voltage is above the point at which provides optimal performance for a non-volatile memory array configuration. For example, for the array method described in PCT patent application number PCT/US93/10485, incorporated herein by reference, with a SONOS device, the program and erase state threshold voltages are expected to decay and converge over many years to a value close to the reference potential or slightly below, called the end of life window center or equilibrium point. The beginning of life erase state threshold voltage magnitude must be less than the read voltage Vr in order to optimize performance of the array described in PCT/US93/10485. It is desirable to select the blocking oxide 43 thickness such that the erase threshold voltage saturates at a magnitude less than Vr once Vr is selected for a given product.

The selection of the top blocking oxide 43 thickness is done by considering the stack layer thicknesses, the applied erase voltage and resulting electric fields and the change in threshold voltage desired from the end of life center value. Since the bottom current 200 and gate current 205 are primarily determined by tunneling probabilities, saturation will occur when the two tunneling probabilities are nearly equal to one another. Tunneling from the channel occurs by both modified Fowler-Nordheim and trap assisted tunneling once enough charge has accumulated to shift the threshold voltage past the equilibrium end of life value. Both of these mechanisms are controlled to first order by the product of the probability of tunneling through the bottom tunnel oxide 41 and the nitride 42. Tunneling through the top oxide 43 is primarily due to Fowler-Nordheim tunneling, and so is controlled by the probability of F-N tunneling through the top blocking oxide 43. So the erase saturation occurs when the probability of tunneling from the channel through the bottom oxide 41 and the nitride 42 is approximately equal to the probability of tunneling from the gate through the top oxide 43, $P_{BOX} P_{NIT} \approx P_{TOX}$.

Using the well known standard expressions for tunneling probabilities, the value for the top oxide 43 thickness $W_{TOX}$ can be described as $$W_{TOX,e} \approx [(W_{BOX} + W_{NIT} \epsilon_{SiO2}/\epsilon_{NIT}) \Delta Vt]/[(V_{PP} - \Phi_{MS} - \Delta VT)(1-\alpha_e) - \alpha_e \Delta Vt]$$

where $W_{BOX}$ and $W_{NIT}$ are the thickness of the bottom tunnel oxide 41 and the memory dielectric 42 respectively, $\epsilon_{SiO2}$ and $\epsilon_{NIT}$ are the relative dielectric coefficients of the bottom oxide 41 and the memory dielectric 42, respectively and $\Delta Vt$ is the desired difference between the equilibrium end of life threshold voltage and the saturated erase threshold voltage. In the denominator, $V_{PP}$ is the voltage applied between the gate and the channel, or bulk, and $\Phi_{MS}$ is the gate to substrate work function.

Figure 8:
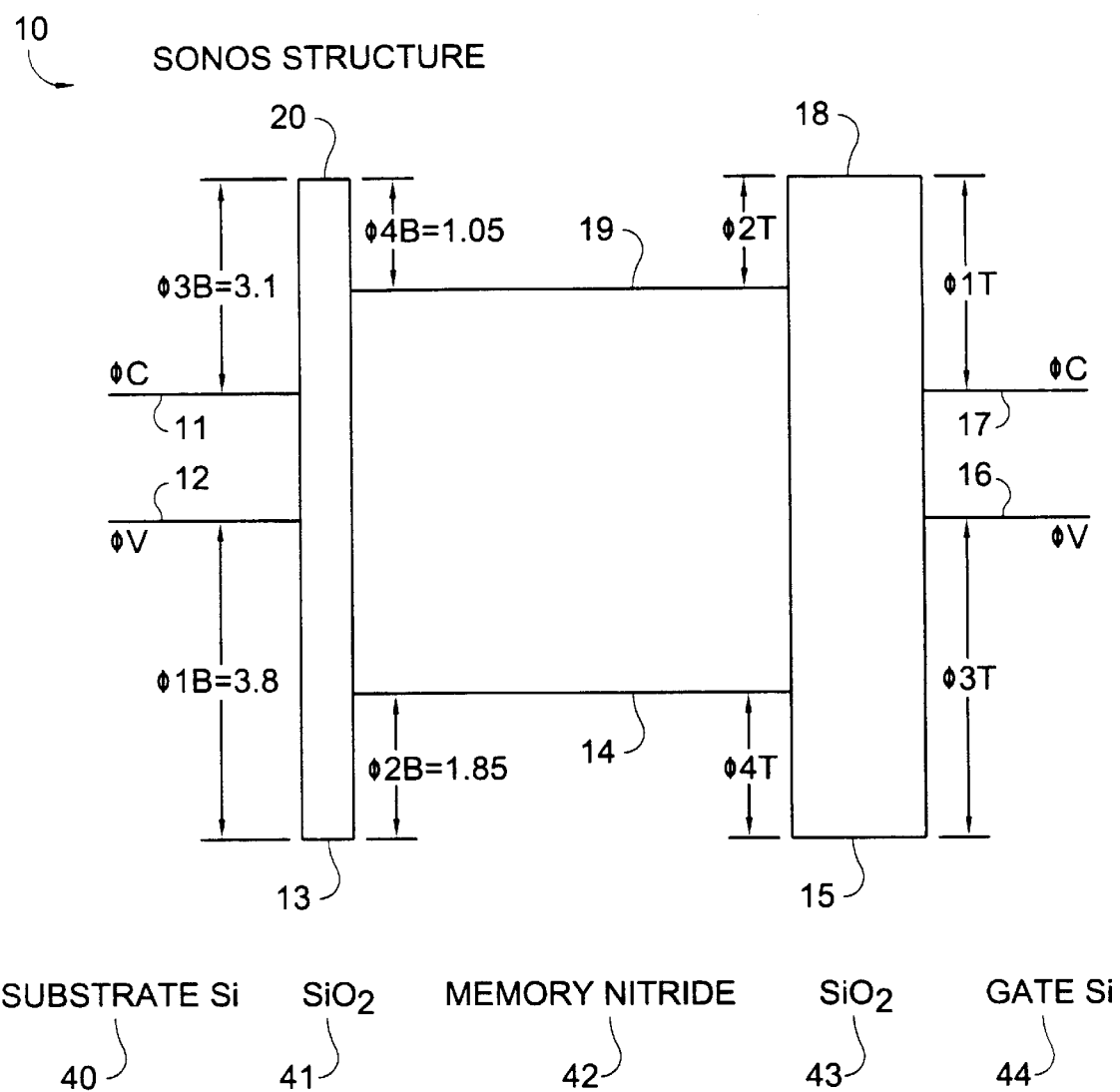
FIG. 8 shows a quantum mechanical energy band diagram of a five layer SONOS structure, including a single crystal silicon substrate, a layer of bottom silicon dioxide, a silicon nitride layer, a top (or blocking) layer of silicon dioxide and a layer of polycrystalline silicon, and the associated nomenclature for the various energy difference values used in models according to a preferred embodiment of the present invention.

Referring additionally now to FIG. 8, the term $\alpha_e$ is an expression that depends on the materials defined as $$\alpha_e = [(M^*_{TOX})^{1/2} \epsilon_{SiO2} \Phi_{1T}^{3/2}]/[(M^*_{NIT})^{1/2} \Phi_{NIT}(\Phi_{1B} - \Phi_{2B})^{3/2}]$$

where $M^*_{TOX}$ is the effective mass of carriers that tunnel into the top blocking dielectric 43 (in this case of SONOS electrons in the SiO2 conduction band), $M^*_{NIT}$ is the effective mass of carriers that tunnel into the memory dielectric 42 (in this case of SONOS holes in the nitride 42 valence band), $\Phi_{1T}$ is the energy barrier height that results from the difference between the gate silicon 44 and blocking oxide 43 conduction band edge energy levels, 17 and 18, respectively, $\Phi_{1B}$ is the barrier between the substrate silicon 40 and tunnel dielectric 41 valence band edges, 12 and 13, respectively, and $\Phi_{2B}$ is the barrier between the memory dielectric 42 valence band edge 14 and the valence band edge 13 for the bottom tunnel oxide 41. The term $\alpha$ will depend on the choice of materials and the content of impurities in the materials, such as oxygen content in silicon nitride 42. It is expected that for a SONOS structure $1.3 \leq \alpha_e \leq 1.6$ with $\alpha_e = 1.40$ being typical.

In the example shown above in FIG. 7 where, $W_{BOX} = 16$ Å, $W_{NIT} = 117$ Å, $V_{PP} = -10$ V, $\Phi_{MS} = -0.9$ and $\Delta Vt = 1.1$ V, the equations above produce $W_{TOX} = 36$ Å, with $\alpha = 1.40$. This is approximately equal to the value of 35 Å used in the calculation, whose results closely agree with data from structures with this composition.

Thus, it is apparent that a nonvolatile memory transistor can be designed which includes two separate simultaneous injection sources that are controlled by accumulated charge in a way the leads to a natural saturation and thus prevents over erasure.

Note that this saturation effect can also be used to prevent over programming. In FIG. 7 the saturation effect is seen as the program threshold voltage nears 1.8 volts. The saturation points for program and erase are not independently controllable using this method, however usually either the erase or the program state threshold voltage, not both, is critical to the operation of a single transistor cell array. For example in NOR architecture memory arrays the erase threshold voltage is critical, however, in NAND architecture memory arrays the program threshold voltage control is critical. When selection of the blocking oxide 43 thickness is determined by the depth of the program threshold voltage, the equations shown above for $W_{TOX}$ and $\alpha$ can be used with the appropriate changes in constants in the definition of oe to convert it to ap as shown in the table below. Here we have used a convention of $M^*_{x,y}$ to represent the effective mass of free carrier x in material y.

| Erase | $\alpha_e$ | $M^*_{TOX} = M^*_{e,SiO2}$ | $\Phi_{1T}$ | $M^*_{NIT} = M^*_{h,Ni t}$ | $\Phi_{1B}$ | $\Phi_{2B}$ |
|---|---|---|---|---|---|---|
| Program | $\alpha_p$ | $M^*_{TOX} = M^*_{h,SiO2}$ | $\Phi_{3T}$ | $M^*_{NIT} = M^*_{e,Ni t}$ | $\Phi_{3B}$ | $\Phi_{4B}$ |

This conversion results in $1.9 \leq \alpha_p \leq 2.2$ with $\alpha_p = 1.96$ being typical.

Also the equation for $W_{TOX}$ must be modified to include the voltage drop in the substrate and gate depletion layers as shown below.

$$W_{TOX,p} \approx [(W_{BOX} + W_{NIT} \epsilon_{SiO2}/\epsilon_{NIT}) \Delta Vt]/[(V_{PP} - \Phi_{MS} - \Phi_{SUB} - \Phi_{GATE} - \Delta Vt)(1-\alpha_p) - \alpha_p \Delta Vt]$$

The terms $\Phi_{SUB}$ and $\Phi_{GATE}$ are functions of the doping levels and the applied voltage and can be calculated using well known semiconductor MIS equations. In the example shown in FIG. 7 the terms $(-\Phi_{SUB} - \Phi_{GATE}) = -3.1$ V near the desired threshold voltage shift of $-2.3$ V. Using the above equation with $\alpha_p = 1.96$, $W_{TOX,p} = 37$ Å, roughly agreeing with the value of 35 Å used for the calculated results shown in FIG. 7.

It is now apparent that a nonvolatile memory transistor can be designed which includes two separate simultaneous injection sources that are controlled by accumulated charge in a way the leads to a natural saturation and thus prevents over programming.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A non-volatile integrated memory device, comprising:
   a semiconductor substrate;
   a memory transistor in said substrate, said memory transistor having an electrically alterable threshold voltage, said memory transistor having a source region, a drain region, a channel region between said source and drain regions in said substrate, a gate, and a charge storage layer between at least portions of said gate and said substrate;
   means for simultaneously injecting charge into said charge storage layer from at least a first node and a second node during a write operation in which the threshold voltage of said memory transistor is charged;
   and means for setting current flows from said first and second nodes to be substantially equal in magnitude when a predetermined value is achieved during the write operation.

2. The device according to claim 1 wherein at least one of said nodes provides current by quantum mechanical tunneling.

3. The device according to claim 1 wherein said means for setting the current flow from said nodes comprises at least means for controlling an externally applied voltage to create an electric field and the electric field created by the accumulated charge in said charge storage layer to control the current from said first and second nodes.

4. The device according to claim 3 wherein said means to set current flow further comprises means for decreasing the magnitude of current from said first node and to simultaneously increase the magnitude of current from said second node as said accumulated charge increases.

5. The device according to claim 3 wherein said externally applied voltage is applied between said gate and said substrate.

6. The device according to claim 1 wherein said first node comprises said memory transistor channel.

7. The device according to claim 1 wherein said second node comprises said memory transistor gate.

8. The device according to claim 1 further comprising a bottom tunnel oxide between said substrate and said charge storage layer and a top blocking dielectric between said gate and said charge storage layer.

9. The device according to claim 8 wherein said charge storage layer comprises silicon nitride and said top blocking dielectric comprises a layer of silicon dioxide.

10. The device according to claim 8 wherein said charge storage layer comprises a floating gate of conductive material.

11. The device according to claim 8 wherein said top blocking dielectric is a three layer composite structure of silicon dioxide, silicon nitride, and silicon dioxide.

12. The device according to claim 1 wherein said memory transistor is a SONOS tunneling metal insulator semiconductor field effect transistor.

13. The device according to claim 1 wherein said charge storage layer comprises silicon oxynitride.

14. The device according to claim 1 wherein said charge storage layer comprises a floating gate of conductive material.

15. The device according to claim 1 wherein said substrate has a first conductivity type and said source and drain regions have a second conductivity type.

16. A method for preventing over erasure in a non-volatile memory cell, comprising:

injecting a first current into the memory cell to erase the memory cell during an erase operation;

injecting a second current into the memory cell, wherein said second current is injected during at least a period of time when said first current is injected, to prevent over erasure of the cell during the erase operation.

17. The method of claim 16 further comprising adjusting said first and second currents to offset one another.

18. The method of claim 16 wherein said first and second currents are injected from respective separate injection nodes.

19. The method of claim 16 wherein said first and second currents are respectively dominant at different periods of time during the write operation.

20. The devices of claim 1 wherein said write operation comprises an erase operation.

21. The device of claim 1 wherein said write operation comprises a program operation.

22. The device of claim 1 wherein said predetermined value is an erased state threshold voltage.

23. The device of claim 1 wherein said predetermined value is a programmed state threshold voltage.

24. A method for preventing over-writing a non-volatile memory cell during a write operation, wherein said write operation purposely changes the threshold voltage of a non-volatile transistor within said non-volatile memory cell, and wherein said over-writing inadvertently results when said threshold voltage changes to a value beyond a predetermined level, comprising:

injecting a first current into said non-volatile memory cell to purposely change said threshold voltage during a write operation;

injecting a second current into said non-volatile memory cell to prevent over-writing said non-volatile memory cell;

accumulating charge from said first and second currents within said non-volatile memory cell; and utilizing said accumulating charge to create an electric field that constrains changes in said first and second currents when they achieve respective predetermined levels.

25. The method according to claim 24 wherein said write operation comprises an erase operation.

26. The method according to claim 24 wherein said write operation comprises a program operation.

27. The method according to claim 24 wherein said non-volatile transistor comprises a floating-gate non-volatile field effect transistor.

28. The method according to claim 24 wherein said non-volatile memory transistor comprises a SONOS non-volatile field effect transistor.

29. The method according to claim 24 wherein said first and second currents are injected from respective separate injection nodes.

30. The method according to claim 24 wherein said first and second currents are respectively dominant at different periods of time during the write operation.

31. The method according to claim 24 wherein said respective predetermined levels for said first and second currents constitute values that are substantially equal in magnitude.

32. The method according to claim 24 wherein said first current is injected through the channel of said non-volatile memory transistor.

33. The method according to claim 24 wherein said second current is injected through the gate of said non-volatile memory transistor.

* * * * *